US010600840B1

(12) United States Patent
Tsuno

(10) Patent No.: US 10,600,840 B1
(45) Date of Patent: Mar. 24, 2020

(54) IMAGING DEVICE HAVING A DIFFUSION REGION ELECTRICALLY CONNECTED TO A PHOTOELECTRIC CONVERTER AND OVERLAPPING A REGION PENETRATING ANOTHER REGION OF OPPOSITE CONDUCTIVITY

(71) Applicant: Panasonic Intellectual Property Management Co., Ltd., Osaka (JP)

(72) Inventor: Morikazu Tsuno, Toyama (JP)

(73) Assignee: Panasonic Intellectual Property Management Co., Ltd., Osaka (JP)

( * ) Notice: Subject to any disclaimer, the term of this patent is extended or adjusted under 35 U.S.C. 154(b) by 0 days.

(21) Appl. No.: 16/566,873

(22) Filed: Sep. 11, 2019

(30) Foreign Application Priority Data

Oct. 1, 2018 (JP) ................................ 2018-186469

(51) Int. Cl.
*H01L 27/146* (2006.01)
*H01L 27/148* (2006.01)

(52) U.S. Cl.
CPC .. *H01L 27/14806* (2013.01); *H01L 27/14603* (2013.01); *H01L 27/14605* (2013.01); *H01L 27/14612* (2013.01); *H01L 27/14636* (2013.01); *H01L 27/14643* (2013.01); *H01L 27/14665* (2013.01); *H01L 27/14641* (2013.01)

(58) Field of Classification Search
CPC ....... H01L 27/14665–14676; H01L 27/14893; H01L 27/307; H01L 27/14663; H01L 27/14612; H01L 27/14643; H01L 27/14603; H01L 27/14605; H01L 27/14636; H01L 27/14689; H01L 27/14638
See application file for complete search history.

(56) References Cited

U.S. PATENT DOCUMENTS 8,785,983 B2 * 7/2014 Ezaki ............... H01L 27/14603 257/225
2014/0043510 A1 2/2014 Kasuga et al.
(Continued)

FOREIGN PATENT DOCUMENTS

| JP | 2010-114274 | 5/2010 |
|---|---|---|
| JP | 2018-050035 | 3/2018 |
| WO | 2012/147302 | 11/2012 |

*Primary Examiner* — Younes Boulghassoul
(74) *Attorney, Agent, or Firm* — McDermott Will & Emery LLP

(57) ABSTRACT

An imaging device includes a semiconductor substrate and a pixel. The semiconductor substrate includes first and second surfaces that oppose each other, a first region containing an impurity of a first conductivity type, a second region that contains an impurity of a second conductivity type and that is closer to the first surface than the first region is, a third region that contains an impurity of the first conductivity type and that is closer to the first surface than the second region is, and a fourth region that provides connection between the first and third regions and that contains an impurity of the first conductivity type. The pixel includes a photoelectric converter, and a first diffusion region that is electrically connected to the photoelectric converter, that is located in the third region, that is exposed at the first surface, and that overlaps the entire first diffusion region in plan view.

7 Claims, 7 Drawing Sheets

10 12 12a 12b 12c 35 53 89 34 36 90 24 26 22 22e 26e Cp4 24e Cp3 Cp1 Cp2 73 72 71 69 h4 h3 h1 h2 65p 63p 62n 60 61 64a 68dn 68en 68cn 68bn 69 66p 67b 67a 67n 66 68an

(56) References Cited

U.S. PATENT DOCUMENTS

2014/0138748 A1* 5/2014 Janesick ............ H01L 27/1461 257/230
2015/0263058 A1* 9/2015 Konstantin ......... H01L 27/1461 257/292
2016/0079297 A1* 3/2016 Sato .................. H01L 27/14643 257/291
2017/0250216 A1* 8/2017 Sato .................. H01L 27/14665
2018/0083004 A1* 3/2018 Sato .................... H01L 27/0922

* cited by examiner 10
12
12a
12b
12c
90
89
53
36
34
35
26
26e
22
22e
24
24e
Cp1
Cp2
Cp3
Cp4
73
72
71
69
60
65p
63p
62n
61
68an
h1
h2
h3
h4
66
66p
67a
67b
67n
68bn
68cn
68en
68dn
64a 10A
12
12a
12b
12c
90
60
69
65p
63p
62n
61
68an
h2
66
h1
67a
67b
67n
66pA
68bn
h3
68cn
68en
68dn
h4
Cp1
Cp2
Cp3
Cp4
26
26e
22
22e
24
24e
36
34
35
53
89
73
72
71

IMAGING DEVICE HAVING A DIFFUSION REGION ELECTRICALLY CONNECTED TO A PHOTOELECTRIC CONVERTER AND OVERLAPPING A REGION PENETRATING ANOTHER REGION OF OPPOSITE CONDUCTIVITY

BACKGROUND

1. Technical Field

The present disclosure relates to imaging devices.

2. Description of the Related Art

Charge-coupled device (CCD) image sensors and complementary metal-oxide semiconductor (CMOS) image sensors are widely used in digital cameras and so on. These image sensors have photodiodes formed on semiconductor substrates.

For example, a structure in which a photoelectric conversion layer, instead of photodiodes, is arranged at the upper side of a semiconductor substrate has also been proposed, as disclosed in International Publication No. 2012/147302. An imaging device having such a structure may be called a stacked-type imaging device. In the stacked-type imaging device, charge generated by photoelectric conversion is temporarily accumulated in a diffusion region or the like, formed in a semiconductor substrate, as signal charge. Signals corresponding to the accumulated amount of charge are read via a CCD circuit or CMOS circuit formed on the semiconductor substrate.

When charge that is different from the signal charge, which represents an image, flows into the diffusion region where the signal charge is temporarily accumulated, the charge can be a cause of noise that deteriorates an image to be acquired. It is advantageous if movement of such unintended charge can be suppressed or reduced. In the following description, such unintended charge may be referred to as "dark current" or "leakage current".

SUMMARY

In one general aspect, the techniques disclosed here feature an imaging device including a semiconductor substrate and a pixel. The semiconductor substrate has a first surface and a second surface at an opposite side of the first surface. The semiconductor substrate includes a first region that contains an impurity of a first conductivity type, a second region that contains an impurity of a second conductivity type different from the first conductivity type and that is closer to the first surface than the first region is, a third region that contains an impurity of the first conductivity type and that is closer to the first surface than the second region is, and a fourth region that contains an impurity of the first conductivity type and that penetrates the second region to provide connection between the first region and the third region. The pixel includes a photoelectric converter that converts light into charge, and a first diffusion region that is electrically connected to the photoelectric converter and that contains an impurity of the second conductivity type. The first diffusion region is located in the third region and exposed at the first surface. In plan view, the fourth region overlaps the entire first diffusion region.

It should be noted that general or specific embodiments may be implemented as an element, a device, a module, a system, or a method. It should also be noted that general or specific embodiments may be implemented as any selective combination of an element, a device, an apparatus, a module, a system, and a method.

Additional benefits and advantages of the disclosed embodiments will become apparent from the specification and drawings. The benefits and/or advantages may be individually obtained by the various embodiments and features of the specification and drawings, which need not all be provided in order to obtain one or more of such benefits and/or advantages.

DETAILED DESCRIPTION (Overview of Present Disclosure)

Figure 1:
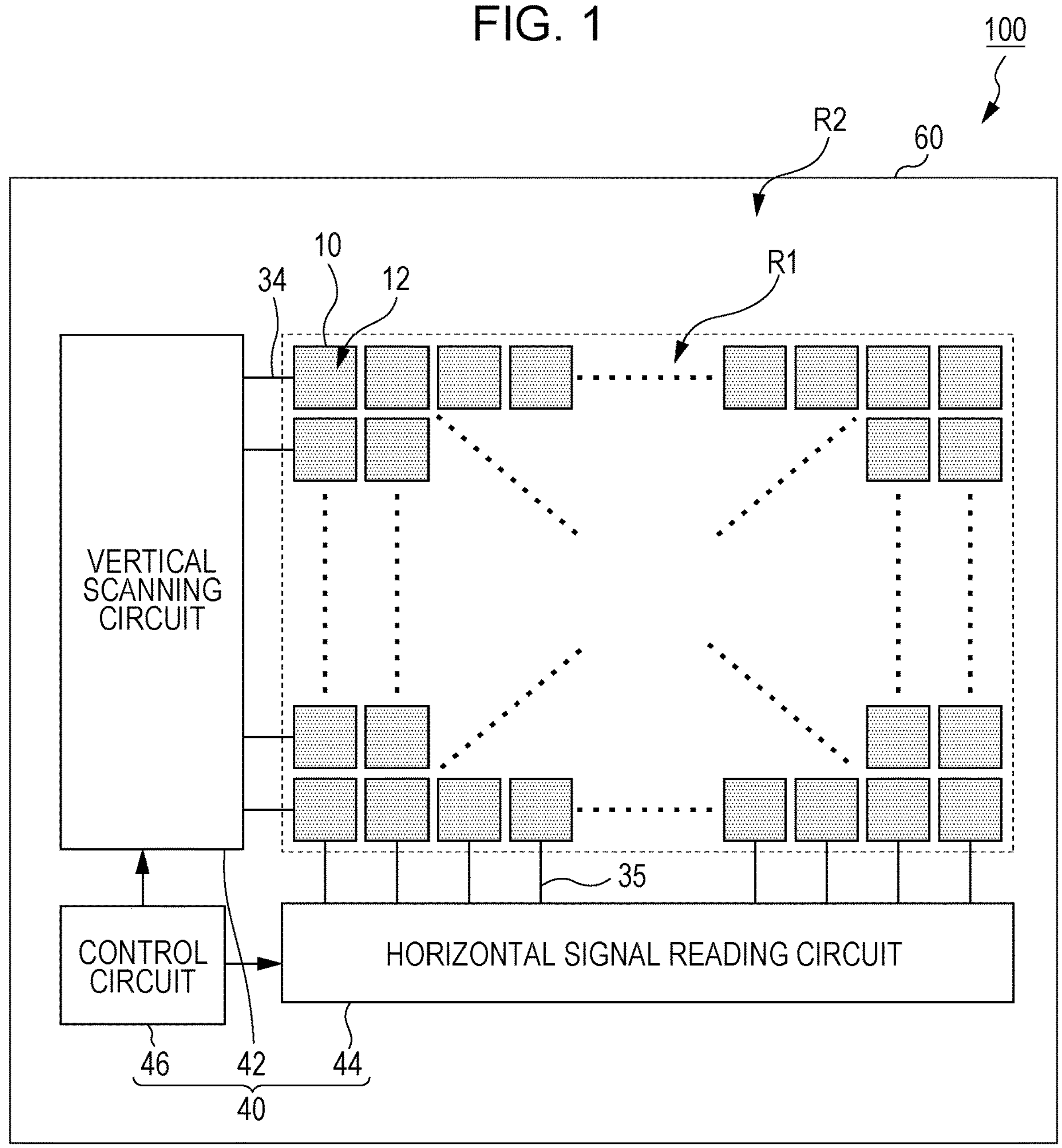
FIG. 1 is a diagram illustrating an exemplary configuration of an imaging device according to a first embodiment of the present disclosure.

An overview of one aspect of the present disclosure is as follows.

An imaging device according to one aspect of the present disclosure includes a semiconductor substrate and a pixel. The semiconductor substrate has a first surface and a second surface at an opposite side of the first surface. The semiconductor substrate includes: a first region that contains an impurity of a first conductivity type; a second region that contains an impurity of a second conductivity type different from the first conductivity type and that is closer to the first surface than the first region is; a third region that contains an impurity of the first conductivity type and that is closer to the first surface than the second region is; and a fourth region that contains an impurity of the first conductivity type and that penetrates the second region to provide connection between the first region and the third region. The pixel includes: a photoelectric converter that converts light into charge; and a first diffusion region that is electrically connected to the photoelectric converter and that contains an impurity of the second conductivity type. The first diffusion region is located in the third region and exposed at the first surface. In plan view, the fourth region overlaps the entire first diffusion region.

The second region of the second conductivity type captures minority carriers contained in the third region of the first conductivity type to thereby suppress or reduce the minority carriers flowing into the first diffusion region, which is a charge accumulation region. Thus, since the second region is provided, it is possible to sufficiently suppress or reduce dark current that flows into the first diffusion region.

Meanwhile, a charge trapping site is generated at a p-n junction between the second region of the second conductivity type and the third region of the first conductivity type. Thus, there is a possibility that minority carriers trapped in the trapping site diffuse to thereby cause dark current to flow to the first diffusion region.

In the imaging device according to this aspect, when viewed from a direction orthogonal to the semiconductor substrate, the first diffusion region of the second conductivity type and the fourth region of the first conductivity type overlap each other. In other words, the second region is not arranged immediately below the first diffusion region. That is, neither a p-n junction between the second region and the third region nor a p-n junction between the second region and the first region is formed immediately below the first diffusion region. Accordingly, the generation of the trapping site is suppressed or reduced in a direction immediately below the first diffusion region. Thus, since minority-carrier trapping, which is a cause of dark current, is suppressed or reduced in the vicinity of the first diffusion region, it is possible to suppress or reduce dark current that is generated in the first diffusion region. Accordingly, it is possible to suppress or reduce image deterioration due to dark current that is generated in the first diffusion region.

For example, the pixel may further include a plurality of second diffusion regions that contain an impurity of the second conductivity type. The plurality of second diffusion regions may be located in the third region and exposed at the first surface. In plan view, the fourth region does not necessarily have to overlap the closest second diffusion region of the plurality of second diffusion regions to the first diffusion region.

According to this configuration, since the second region captures minority carriers, it is possible to suppress or reduce dark current that flows into the first diffusion region.

For example, in plan view, the fourth region may overlap a halfway point between the first diffusion region and the closest second diffusion region of the plurality of second diffusion regions to the first diffusion region.

According to this configuration, arranging the boundary of the fourth region so as to be closer to the second diffusion region than to the first diffusion region when viewed from the direction orthogonal to the semiconductor substrate allows charge generated in a trapping site between the fourth region and the second region to be collected in the second diffusion region. Thus, flow of charge into the first diffusion region, which is a charge accumulation region, can be suppressed or reduced, and dark current can be further suppressed or reduced.

For example, a portion that is included in the fourth region and that is closest to the first surface may be closer to the first surface than a portion that is included in the second region and that is closest to the first surface is; and a portion that is included in the fourth region and that is closest to the second surface may be closer to the second surface than a portion that is included in the second region and that is closest to the second surface is.

For example, an impurity concentration of the fourth region may be higher than an impurity concentration of each of the first region, the second region, and the third region.

According to this configuration, it is possible to reduce connection resistance between the first region and the third region. Accordingly, even if a substrate potential applied to the first region is not constant, for example, holes generated at a p-n junction can be easily discharged via the first region. This makes it possible to suppress or reduce image deterioration due to variations in the substrate potential.

For example, during operation, a potential of the second region may be controlled to be constant. That is, during operation, a fixed potential may be applied to the second region.

For example, the second region does not necessarily have to be electrically connected to the first diffusion region.

In the present disclosure, all or a part of any of circuits, units, devices, parts, or portions or any of functional blocks in the block diagrams may be implemented as one or more of electronic circuits including, but not limited to, a semiconductor device, a semiconductor integrated circuit (IC), or a large-scale integration (LSI). The LSI or IC can be integrated into one chip or also can be a combination of a plurality of chips. For example, functional blocks other than a memory may be integrated into one chip. Although the name used here is an LSI or IC, it may also be called a system LSI, a very large scale integration (VLSI), or an ultra large scale integration (ULSI) depending on the degree of integration. A field programmable gate array (FPGA) that can be programmed after manufacturing an LSI or a reconfigurable logic device that allows reconfiguration of the connection or setup of circuit cells inside the LSI can also be used for the same purpose.

Further, the functions or operations of all or a part of the circuits, units, devices, parts, or portions can be implemented by executing software. In such a case, the software is recorded on one or more non-transitory recording media, such as a ROM, an optical disk, or a hard disk drive, and when the software is executed by a processor, the software causes the processor together with peripheral devices to execute the functions specified in the software. A system, an apparatus, or a device may include such one or more non-transitory recording media on which the software is recorded and a processor together with necessary hardware devices such as an interface.

Embodiments of the present disclosure will be described in detail with reference to the accompanying drawings. The embodiments described below each represent a general or specific example. Numerical values, shapes, materials, constituent elements, the arrangement and the connections of constituent elements, steps, the order of steps, and so on described in the embodiments below are examples and are not intended to limit the present disclosure. Various aspects described herein can be combined together, as long as such a combination does not cause contradiction. Also, of the constituent elements in the embodiments below, constituent elements not set forth in the independent claim will be described as optional constituent elements. In the following description, constituent elements having substantially the same functions are denoted by the same reference numerals, and descriptions thereof may be omitted. Illustration of some of the elements may be omitted in order to avoid excessive complication of the drawings.

Various elements illustrated in the drawings are merely schematically illustrated for understanding of the present disclosure, and dimensional ratios, external appearances, and so on may differ from those of actual elements. That is, the drawings are schematic diagrams and are not necessarily strictly illustrated. Accordingly, for example, scales and so on do not necessarily match in each drawing.

Herein, the terms "parallel", "match", and so on representing relationships between elements, terms representing element shapes, such as "circular shape" and "rectangular shape", and the ranges of numerical values are not only expressions representing exact meanings but also expressions representing substantially equivalent terms and ranges, for example, expressions meaning that the terms include, for example, differences of about several percent.

Herein, the terms "upper side" and "lower side" do not refer to an upper direction (vertically upper side) and a lower direction (vertically lower side) in absolute spatial recognition and are used as terms defined by relative positional relationships based on the order of stacked layers in a stacked configuration. Specifically, the light receiving side of an imaging device is referred to as the "upper side", and the opposite side of the light receiving side is referred to as the "lower side". Similarly, with respect to an "upper surface" and a "lower surface" of each member, a surface that opposes the light receiving side of the imaging device is referred to as an "upper surface" and a surface that opposes the light receiving side at its opposite side is referred to as a "lower surface". The terms "upper side", "lower side", "upper surface", "lower surface", and so on are used to merely designate mutual arrangements among members and are not intended to limit orientations during use of the imaging device. The terms "upper side" and "lower side" apply to not only cases in which a constituent element exists between two constituent elements arranged with a gap therebetween and but also cases in which two constituent element are arranged in close contact with each other. In addition, the term "plan view" refers to a view from a direction orthogonal to a semiconductor substrate.

First Embodiment

FIG. 1 is a diagram illustrating an exemplary configuration of an imaging device according to a first embodiment of the present disclosure. An imaging device 100 illustrated in FIG. 1 has a plurality of pixels 10 and peripheral circuitry 40 which are formed on a semiconductor substrate 60.

The pixels 10 include photoelectric converters 12. Upon light incidence, each photoelectric converter 12 generates positive and negative charges, typically, electron-hole pairs. Each photoelectric converter 12 may have a photoelectric conversion structure including a photoelectric conversion layer arranged at the upper side of the semiconductor substrate 60 or may be a photodiode formed at the semiconductor substrate 60. Although the photoelectric converters 12 in the pixels 10 are illustrated in FIG. 1 as being spatially separated from each other, this is merely for convenience of description, and the photoelectric converters 12 in the pixels 10 may be continuously arranged at the upper side of the semiconductor substrate 60 without gaps therebetween.

In the example illustrated in FIG. 1, the pixels 10 are arrayed in a plurality of rows and columns, that is, m rows and n columns. In this case, m and n each represent an integer greater than or equal to 1. The pixels 10 are, for example, two-dimensionally arranged on the semiconductor substrate 60 to thereby form an image capture region R1. When the pixels 10 have the photoelectric converters 12 arranged, for example, at the upper side of the semiconductor substrate 60, the image capture region R1 can be defined as a region located at the upper side of the semiconductor substrate 60 and covered by the photoelectric converters 12.

The number of pixels 10 and the arrangement thereof are not limited to the illustrated example. For example, the number of pixels 10 included in the imaging device 100 may be one. Although, in this example, the center of each pixel 10 is located on a grid point of a square grid, for instance, the pixels 10 may be arranged so that the center of each pixel 10 is located on a grid point of a triangular grid, a hexagonal grid, or the like. For example, the pixels 10 may be one-dimensionally arranged, in which case, 1, the imaging device 100 can be used as a line sensor.

In the configuration illustrated in FIG. 1, the peripheral circuitry 40 includes a vertical scanning circuit 42 and a horizontal signal reading circuit 44. As illustrated in FIG. 1, the peripheral circuitry 40 may additionally include a control circuit 46. The peripheral circuitry 40 may further include, for example, a voltage supply circuit for supplying a predetermined voltage to the pixels 10 and so on. The peripheral circuitry 40 may further include a signal processing circuit, an output circuit, and so on.

The vertical scanning circuit 42 is also called a row scanning circuit and has connections with address signal lines 34 provided corresponding to rows of the pixels 10. Signal lines provided corresponding to the rows of the pixels 10 are not limited to the address signal lines 34, and multiple types of signal lines may be connected to the vertical scanning circuit 42 for the respective rows of the pixels 10. The horizontal signal reading circuit 44 may also be called a column scanning circuit and has connections with vertical signal lines 35 provided corresponding to the columns of the pixels 10.

For example, upon receiving command data, a clock, and so on given from outside of the imaging device 100, the control circuit 46 controls the entire imaging device 100. Typically, the control circuit 46 has a timing generator and supplies drive signals to the vertical scanning circuit 42, the horizontal signal reading circuit 44, a voltage supply circuit, which is described below, and so on. In FIG. 1, arrows that extend from the control circuit 46 schematically represent flows of signal outputs from the control circuit 46. The control circuit 46 may be realized by, for example, a microcontroller including one or more processors. The functions of the control circuit 46 may be realized by a combination of a general-purpose processing circuit and software or may be realized by hardware that is dedicated to such processing.

Figure 2:
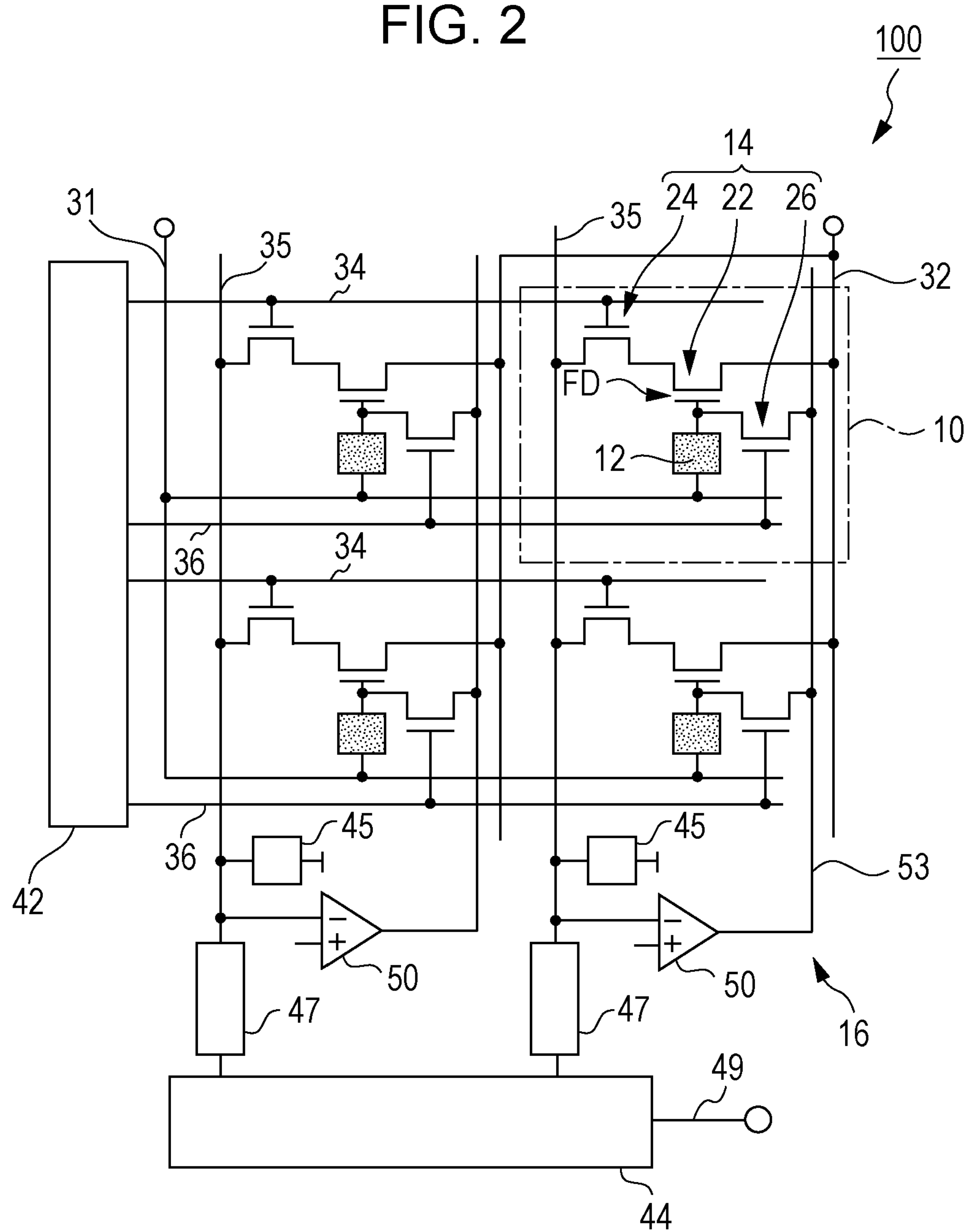
FIG. 2 is a schematic diagram schematically illustrating an exemplary circuit configuration of the imaging device according to the first embodiment of the present disclosure.

FIG. 2 is a schematic diagram schematically illustrating an exemplary circuit configuration of the imaging device according to the first embodiment of the present disclosure. In FIG. 2, four pixels 10 arrayed in 2 rows and 2 columns are illustrated as representatives in order to avoid complicating the drawing. These pixels 10 are examples of some of the pixels 10 illustrated in FIG. 1. Each pixel 10 has the photoelectric converter 12 and includes a signal detection circuit 14 electrically connected to the photoelectric converter 12. As described below in detail with reference to FIG. 3, the photoelectric converter 12 includes a photoelectric conversion layer 12*b* arranged at the upper side of the semiconductor substrate 60. That is, in this case, a stacked-type imaging device will be described as an example of the imaging device 100.

The photoelectric converter 12 in each pixel 10 has a connection with an accumulation control line 31. During operation of the imaging device 100, a predetermined voltage is applied to the accumulation control line 31. For example, when a positive charge of positive and negative charges generated by photoelectric conversion is used as signal charge, for example, a positive voltage of about 10 V may be applied to the accumulation control line 31 during operation of the imaging device 100. A case in which holes are used as signal charge will be described below by way of example.

In the configuration illustrated in FIG. 2, the signal detection circuit 14 includes a signal detection transistor 22, an address transistor 24, and a reset transistor 26. As described below in detail with reference to the accompanying drawings, the signal detection transistor 22, the address transistor 24, and the reset transistor 26 are typically field-effect transistors (FETs) formed on the semiconductor substrate 60, which supports the photoelectric converter 12. An example in which N-channel MOSFETs are used as the signal detection transistor 22, the address transistor 24, and the reset transistor 26 will be described below, unless otherwise particularly stated.

As schematically illustrated in FIG. 2, a gate of the signal detection transistor 22 is electrically connected to the photoelectric converter 12. In the illustrated example, a charge accumulation node FD, which connects the gate of the signal detection transistor 22 to the photoelectric converter 12, has a function for temporarily holding a charge generated by the photoelectric converter 12. When a predetermined voltage is applied to the accumulation control line 31 during operation, for example, holes can be accumulated in the charge accumulation node FD as signal charge. As described below with reference to the accompanying drawings, the charge accumulation node FD includes, in its portion, an impurity region formed in the semiconductor substrate 60.

A drain of each signal detection transistor 22 is connected to a power-supply wire 32, which supplies, for example, a power-supply voltage VDD of about 3.3 V to the corresponding pixels 10 during operation of the imaging device 100, and a source of the signal detection transistor 22 is connected to the vertical signal line 35 via the address transistor 24. When the power-supply voltage VDD is supplied to the drain of the signal detection transistor 22, the signal detection transistor 22 outputs a signal voltage corresponding to the amount of signal charge accumulated in the charge accumulation node FD.

The address signal line 34 is connected to a gate of each address transistor 24, which is connected between the signal detection transistor 22 and the vertical signal line 35. The vertical scanning circuit 42 applies a row selection signal for controlling on and off states of the address transistors 24 to each address signal line 34. Thus, outputs of the signal detection transistors 22 in the selected pixels 10 can be read out to the corresponding vertical signal lines 35. The arrangement of each address transistor 24 is not limited to the example illustrated in FIG. 2, and the address transistor 24 may be arranged between the drain of the signal detection transistor 22 and the power-supply wire 32.

Load circuits 45 and column signal processing circuits 47 are connected to the respective vertical signal lines 35. Each load circuit 45, together with the signal detection transistor 22, forms a source follower circuit. Each column signal processing circuit 47 is also called a row signal accumulation circuit and performs, for example, noise-suppression signal processing, typified by correlated double sampling, and analog-to-digital conversion. The horizontal signal reading circuit 44 sequentially reads signals from the column signal processing circuits 47 to a horizontal common signal line 49. The load circuits 45 and the column signal processing circuits 47 may be portions of the peripheral circuitry 40.

Reset signal lines 36, which have connections with the vertical scanning circuit 42, are connected to gates of the reset transistors 26. Similarly to the address signal lines 34, the reset signal lines 36 are provided for the respective rows of the pixels 10. The vertical scanning circuit 42 can select the pixels 10 to be reset for each row by applying a row selection signal to the address signal line 34 and can switch between the on and off states of the reset transistors 26 in the selected row by applying a reset signal to the gates of the reset transistors 26 through the reset signal line 36. When the reset transistors 26 are turned on, potentials at the corresponding charge accumulation nodes FD are reset.

In this example, one of a drain and a source of each reset transistor 26 is connected to the charge accumulation node FD, and the other of the drain and the source is connected to a corresponding one of feedback lines 53 provided for the respective columns of the pixels 10. That is, in this example, a voltage of the feedback line 53 is supplied to the corresponding charge accumulation node FD as a reset voltage for initializing the charge in the corresponding photoelectric converter 12.

In the configuration illustrated in FIG. 2, the imaging device 100 has feedback circuits 16, which include inverting amplifiers 50 in portions of their feedback paths. As illustrated in FIG. 2, the inverting amplifiers 50 are provided for the respective columns of the pixels 10, and each feedback line 53 described above is connected to an output terminal of a corresponding one of the inverting amplifiers 50. The inverting amplifiers 50 may be portions of the above-described peripheral circuitry 40.

An inverting input terminal of each inverting amplifier 50 is connected to the vertical signal line 35 in the corresponding column, as illustrated in FIG. 2, and during operation of the imaging device 100, for example, a reference voltage Vref, which is a positive voltage of 1 V or around 1 V, is supplied to a non-inverting input terminal of the inverting amplifier 50. Turning on the address transistor 24 and the reset transistor 26 makes it possible to form a feedback path through which an output of the corresponding pixel 10 is negatively fed back, and as a result of the formation of the feedback path, a voltage of the corresponding vertical signal line 35 converges to the voltage Vref input to the non-inverting input terminal of the inverting amplifier 50. In other words, as a result of the formation of the feedback path, a voltage at the charge accumulation node FD is reset to a voltage at which the voltage of the vertical signal line 35 reaches the voltage Vref. A voltage with an arbitrary value in the range between a power-supply voltage and a ground voltage is used as the voltage Vref. As a result of the formation of the feedback path, reset noise that is generated when the reset transistors 26 are turned off can be reduced. Details of reset noise suppression utilizing feedback are described in International Publication No. 2012/147302. The entire contents disclosed in International Publication No. 2012/147302 are incorporated herein by reference.

(Device Structure of Pixels 10)

Figure 3:
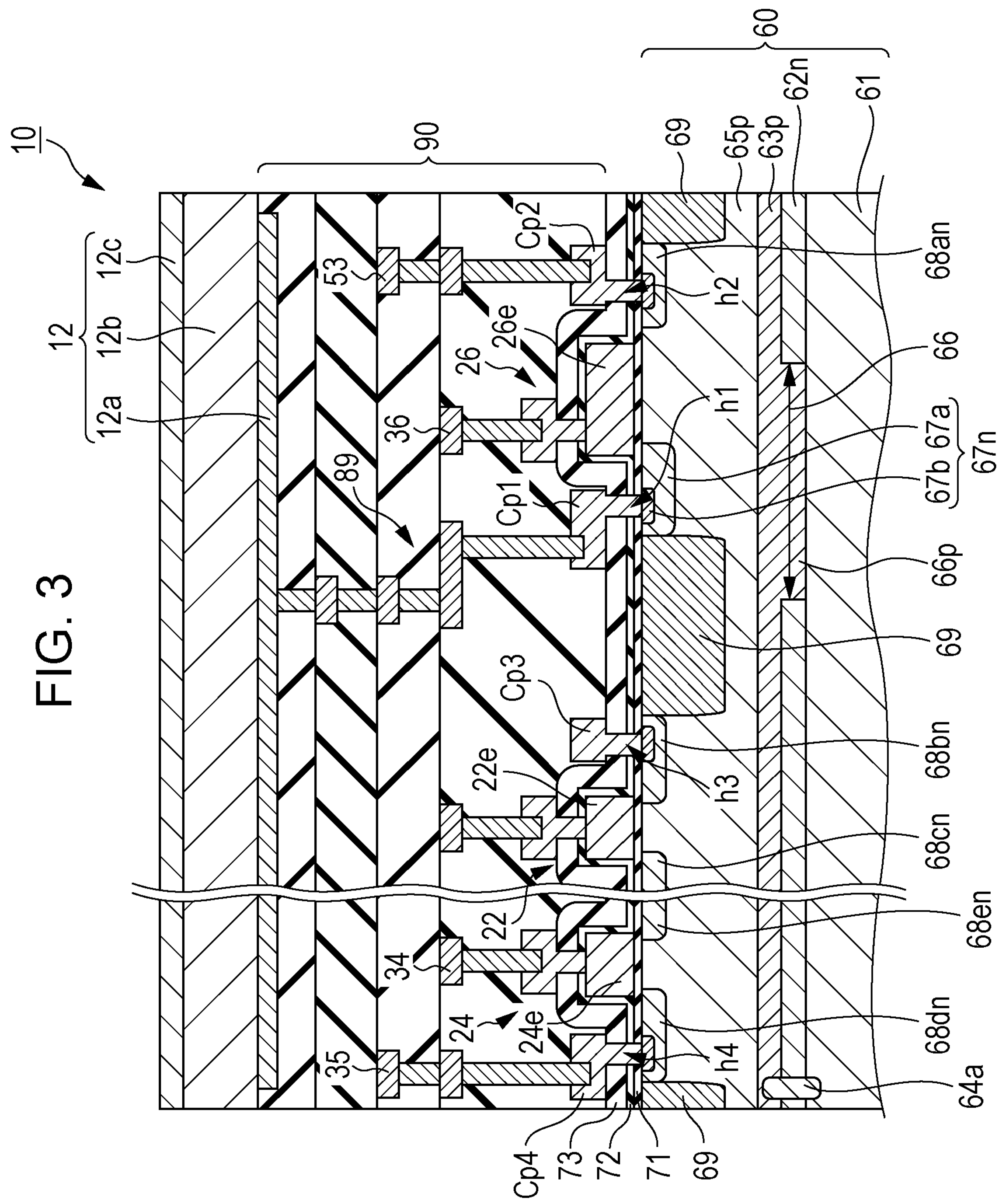
FIG. 3 is a sectional view schematically illustrating one example of a device structure of one pixel in the imaging device according to the first embodiment of the present disclosure.

FIG. 3 is a sectional view schematically illustrating one example of a device structure of one pixel 10 in the imaging device 100 according to the first embodiment of the present disclosure. The pixel 10 generally includes the semiconductor substrate 60, the photoelectric converter 12 arranged at the upper side of the semiconductor substrate 60, and an electrically conductive structure 89. As illustrated in FIG. 3, each photoelectric converter 12 is supported by an interlayer insulating layer 90, which covers the semiconductor substrate 60, and the electrically conductive structure 89 is arranged inside the interlayer insulating layer 90. In the illustrated example, the interlayer insulating layer 90 includes a plurality of insulating layers, and the electrically conductive structure 89 includes portions of respective wiring layers arranged inside the interlayer insulating layer 90. The plurality of wiring layers arranged in the interlayer insulating layer 90 may include, for example, a wiring layer having the address signal lines 34, the reset signal lines 36, and so on in its portion and a wiring layer having the vertical signal lines 35, the power-supply wires 32, the feedback lines 53, and so on in its portion. Needless to say, the number of insulating layers and the number of wiring layers in the interlayer insulating layer 90 are not limited to this example and can be set arbitrarily.

Each photoelectric converter 12 includes a pixel electrode 12*a* formed on the interlayer insulating layer 90, an opposing electrode 12*c* arranged at a light incidence side, and the photoelectric conversion layer 12*b* arranged between the pixel electrode 12*a* and the opposing electrode 12*c*. The photoelectric conversion layer 12*b* is formed of organic material or inorganic material, such as amorphous silicon, and in response to light that is incident via the opposing electrode 12*c*, the photoelectric conversion layer 12*b* performs photoelectric conversion to generate positive and negative charges. Typically, the photoelectric conversion layer 12*b* is continuously formed across the plurality of pixels 10. The photoelectric conversion layer 12*b* is formed in one plate shape that covers most of the image capture region R1 on the semiconductor substrate 60 in plan view. That is, the photoelectric conversion layer 12*b* is shared by two or more pixels 10. In other words, the photoelectric converters 12 provided in the respective pixels 10 have portions that are included in the photoelectric conversion layer 12*b* and that differ from one pixel 10 to another. The photoelectric conversion layer 12*b* may also include a layer constituted by organic material and a layer constituted by inorganic material. The photoelectric conversion layer 12*b* may be separated and be provided for each pixel 10.

The opposing electrode 12*c* is a translucent electrode formed of transparent conductive material, such as an indium tin oxide (ITO). The term "translucent" as used herein means that at least part of light having wavelengths that are absorbable by the photoelectric conversion layer 12*b* is transmitted, and transmitting light in an entire wavelength range of visible light is not essential. Typically, the opposing electrode 12*c* is continuously formed across the plurality of pixels 10, similarly to the photoelectric conversion layer 12*b*. That is, the opposing electrode 12*c* is shared by the plurality of pixels 10. In other words, the photoelectric converters 12 provided in respective pixels 10 have portions that are included in the opposing electrodes 12*c* and that differ from one pixel 10 to another. The opposing electrode 12*c* may be separated and be provided for each pixel 10.

Although not illustrated in FIG. 3, the opposing electrode 12*c* has a connection with the accumulation control lines 31. During operation of the imaging device 100, a potential of the accumulation control line 31 is controlled to increase a potential at the opposing electrode 12*c* to a potential higher than a potential at the pixel electrode 12*a* to thereby allow each pixel electrode 12*a* to selectively collect a positive charge of positive and negative charges generated by photoelectric conversion. When the opposing electrode 12*c* is formed in the form of a single layer that continues across the plurality of pixels 10, it is possible to apply a predetermined potential to the opposing electrode 12*c* in the plurality of pixels 10 at a time.

Each pixel electrode 12*a* is formed of metal, such as aluminum or copper, a metal nitride, or polysilicon or the like given conductivity by impurity doping. Each pixel electrode 12*a* is spatially separated from the pixel electrodes 12*a* in the other adjacent pixels 10 and is thus electrically isolated from the pixel electrodes 12*a* in the other pixels 10.

The electrically conductive structure 89 typically includes a plurality of wires and plugs formed of metal, such as copper or tungsten, or a metal compound, such as a metal nitride or a metal oxide, and polysilicon plugs. One end of the electrically conductive structure 89 is connected to the pixel electrode 12*a*. Another end of the electrically conductive structure 89 is connected to a circuit element formed on the semiconductor substrate 60, so that the pixel electrode 12*a* in the photoelectric converter 12 and a circuit on the semiconductor substrate 60 are electrically connected to each other.

Now, attention is given to the semiconductor substrate 60. As schematically illustrated in FIG. 3, the semiconductor substrate 60 includes a supporting substrate 61 and one or more semiconductor layers formed on the supporting substrate 61. The semiconductor substrate 60 has, as one or more semiconductor layers, an n-type semiconductor layer 62*n* on the supporting substrate 61, a p-type semiconductor layer 63*p* on the n-type semiconductor layer 62*n*, and a p-type semiconductor layer 65*p* located on the p-type semiconductor layer 63*p*.

The semiconductor substrate 60 has a first surface and a second surface located at the opposite side of the first surface. The first surface is a surface at the light incidence side. Specifically, of the plurality of surfaces included in the semiconductor substrate 60, the first surface is the surface at which the photoelectric converters 12 are provided. Herein, an "obverse surface" of the semiconductor substrate 60 corresponds to the first surface, and a "reverse surface" of the semiconductor substrate 60 corresponds to the second surface. Although not illustrated in FIG. 3, the second surface is the surface at which the supporting substrate 61 in the semiconductor substrate 60 is provided.

The supporting substrate 61 is one example of a first region containing an impurity of a first conductivity type. In the present embodiment, the first conductivity type is a p-type. Herein, a p-type silicon substrate will be described as an example of the supporting substrate 61. The p-type impurity contained in the supporting substrate 61 is, for example, boron.

The supporting substrate 61 has connections with substrate contacts (not illustrated in FIG. 3) provided outside the image capture region R1. The supporting substrate 61 is connected to the p-type semiconductor layer 63*p* via a p-type region 66*p* and a p-type region 64*a*, as described below. During operation of the imaging device 100, potentials in the supporting substrate 61 and the p-type semiconductor layer 63*p* are controlled via the substrate contacts. When the p-type semiconductor layer 65*p* is arranged so as to contact the p-type semiconductor layer 63*p*, a potential in the p-type semiconductor layer 65*p* can be controlled via the p-type semiconductor layer 63*p* during operation of the imaging device 100.

The n-type semiconductor layer 62*n* is one example of a second region that contains an impurity of a second conductivity type different from the first conductivity type and that is located closer to the first surface than the first region. In the present embodiment, the second conductivity type is an n-type. The n-type impurity contained in the n-type semiconductor layer 62*n* is, for example, phosphorous. The n-type semiconductor layer 62*n* is provided closer to the obverse surface of the semiconductor substrate 60 than the supporting substrate 61.

Specifically, the n-type semiconductor layer 62*n* is located between the supporting substrate 61 and the p-type semiconductor layer 63*p*. More specifically, the n-type semiconductor layer 62*n* is provided in contact with the upper surface of the supporting substrate 61. The n-type semiconductor layer 62*n* is not formed on the entire upper surface of the supporting substrate 61 and is provided with a through hole 66 for exposing a portion of the upper surface of the supporting substrate 61. When viewed from a direction orthogonal to the semiconductor substrate 60, the through hole 66 is formed at a position where it overlaps a charge accumulation region 67*n* formed of an n-type semiconductor. The p-type region 66*p* is provided in the through hole 66. Details of the p-type region 66*p* are described later. A transistor that provides electrical connection between the n-type semiconductor layer 62*n* and the charge accumulation region 67*n* is not arranged.

Although not illustrated in FIG. 3, a well contact is connected to the n-type semiconductor layer 62*n*. The well contact is provided outside the image capture region R1, and during operation of the imaging device 100, a potential in the n-type semiconductor layer 62*n* is controlled to be constant through the well contact. That is, during operation of the imaging device 100, a fixed potential is applied to the n-type semiconductor layer 62*n*. The provision of the n-type semiconductor layer 62*n* suppresses or reduces flow of minority carriers from the supporting substrate 61 or the peripheral circuitry 40 into the charge accumulation region 67*n* where signal charge is accumulated. That is, the provision of the n-type semiconductor layer 62*n* between the supporting substrate 61 and the p-type semiconductor layer 63*p* makes it possible to suppress or reduce dark current that flows to the charge accumulation region 67*n*.

The p-type semiconductor layer 63*p* is one example of at least a portion of a third region that contains an impurity of the first conductivity type and that is located closer to the first surface than the second region. The p-type semiconductor layer 63*p* is provided closer to the obverse surface of the semiconductor substrate 60 than the n-type semiconductor layer 62*n*. Specifically, the p-type semiconductor layer 63*p* is provided on the n-type semiconductor layer 62*n* in contact with the upper surface thereof. More specifically, the p-type semiconductor layer 63*p* is formed over generally the entire surface of the supporting substrate 61.

The p-type semiconductor layer 65*p* is one example of at least a portion of the third region that contains an impurity of the first conductivity type and that is located closer to the first surface than the second region. In the present embodiment, the stacked structure of the p-type semiconductor layer 63*p* and the p-type semiconductor layer 65*p* is one example of the third region. The p-type semiconductor layer 65*p* is provided closer to the obverse surface of the semiconductor substrate 60 than the p-type semiconductor layer 63*p*. Specifically, the p-type semiconductor layer 65*p* is provided on the p-type semiconductor layer 63*p* in contact with the upper surface thereof.

The n-type semiconductor layer 62*n*, which is the second region, and the p-type semiconductor layers 63*p* and 65*p*, which constitute the third region, are each typically formed by ion-implanting an impurity into a semiconductor film formed by epitaxial growth. For example, the through hole 66 in the n-type semiconductor layer 62*n* is formed by forming a mask on a range corresponding to the through hole 66 and not ion-implanting an n-type impurity into the range corresponding to the through hole 66. Thereafter, a p-type impurity is ion-implanted into only the range corresponding to the through hole 66 to thereby form the p-type region 66*p* so as to fill the through hole 66. The through hole 66 may be formed by forming the n-type semiconductor layer 62*n* on the entire surface of the supporting substrate 61 and then removing a portion of the n-type semiconductor layer 62*n*. The p-type region 66*p* may also be formed by epitaxially growing a semiconductor film so as to fill the formed through hole 66 and then implanting a p-type impurity into the range of the through hole 66 in the semiconductor film. The p-type region 66*p* is one example of a fourth region that penetrates the second region, that provides connection between the first region and the third region, and that contains an impurity of the first conductivity type.

The p-type region 66*p* is substantially a portion of the p-type semiconductor layer 63*p* and has the same composition as that of the p-type semiconductor layer 63*p*. For example, the impurity concentration of the p-type region 66*p* is the same as the impurity concentration of the p-type semiconductor layer 63*p*. The impurity concentrations of the p-type semiconductor layer 63*p* and the p-type semiconductor layer 65*p* are higher than the impurity concentration of the supporting substrate 61. The impurity concentration of the p-type semiconductor layer 63*p* is higher than the impurity concentration of the p-type semiconductor layer 65*p*. The impurity concentration of the supporting substrate 61 is, for example, about $10^{15}$ $cm^{-3}$. The impurity concentration of the p-type semiconductor layer 63*p* is, for example, about $10^{18}$ $cm^{-3}$. The impurity concentration of the p-type semiconductor layer 65*p* is, for example, about $10^{17}$ $cm^{-3}$.

In addition, in the example illustrated in FIG. 3, the p-type region 64*a* is provided between the p-type semiconductor layer 63*p* and the supporting substrate 61 so as to penetrate the n-type semiconductor layer 62*n*. The p-type region 64*a* has a higher impurity concentration than the p-type semiconductor layer 63*p* and the p-type semiconductor layer 65*p* and has a function for providing electrical interconnection between the p-type semiconductor layer 63*p* and the supporting substrate 61.

As schematically illustrated in FIG. 3, a plurality of impurity regions are provided in the p-type semiconductor layer 65*p* in the semiconductor substrate 60. Specifically, the charge accumulation region 67*n* and impurity regions 68*an*, 68*bn*, 68*cn*, 68*dn*, and 68*en* are provided in the p-type semiconductor layer 65*p*.

The charge accumulation region 67*n* is one example of a first diffusion region that contains an impurity of the second conductivity type, that is located in the third region and adjacent to the first surface, and that accumulates a charge. The charge accumulation region 67*n*, which is an n-type, is formed in the vicinity of the obverse surface of the semiconductor substrate 60, and at least a portion of the charge accumulation region 67*n* is located at the obverse surface of the semiconductor substrate 60. In this case, the charge accumulation region 67*n* includes a first region 67*a* and a second region 67*b*, which is located in the first region 67*a* and has a higher impurity concentration than the first region 67*a*. The impurity concentration of the first region 67*a* is, for example, about $10^{17}$ $cm^{-3}$, and the impurity concentration of the second region 67*b* is, for example, about $3\times10^{18}$ $cm^{-3}$. In this case, "x" represents multiplication.

Insulating layers are arranged on the obverse surface of the semiconductor substrate 60. In the example illustrated in FIG. 3, a major surface of the semiconductor substrate 60, the major surface being located adjacent to the photoelectric converter 12, is covered by a first insulating layer 71, a second insulating layer 72, and a third insulating layer 73. The first insulating layer 71 is, for example, a thermally oxidized film of silicon. The second insulating layer 72 is, for example, a silicon dioxide layer, and the third insulating layer 73 is, for example, a silicon nitride layer. The second insulating layer 72 may have a stacked structure including a plurality of insulating layers, and similarly, the third insulating layer 73 may have a stacked structure including a plurality of insulating layers.

The stacked structure of the first insulating layer 71, the second insulating layer 72, and the third insulating layer 73 has a contact hole h1 on the second region 67*b* in the charge accumulation region 67*n*. In the example illustrated in FIG. 3, a contact plug Cp1, which is a portion of the electrically conductive structure 89, is connected to the second region 67*b* through the contact hole h1 to thereby electrically connect the charge accumulation region 67*n* to the pixel electrode 12*a* in the photoelectric converter 12 via the electrically conductive structure 89. The signal charge generated by the photoelectric converter 12 is accumulated in the charge accumulation region 67*n*.

A junction capacitance formed by a p-n junction between the p-type semiconductor layer 65*p*, which serves as a p well, and the charge accumulation region 67*n*, which is an n-type, has a function of a charge accumulation region for temporarily holding the signal charge. The electrically conductive structure 89 and the n-type charge accumulation region 67*n* can be said to constitute at least a portion of the above-described charge accumulation node FD.

The formation of the second region 67*b* in the charge accumulation region 67*n* is not essential. However, connecting the contact plug Cp1 to the second region 67*b* having a relatively high impurity concentration can provide an advantage of reducing contact resistance.

The above-described signal detection circuits 14 are formed on the semiconductor substrate 60. An element isolation region 69 is arranged between the pixels 10 that are adjacent to each other to thereby electrically isolate the signal detection circuit 14 in each pixel 10 from the signal detection circuits 14 in the other adjacent pixels 10. The element isolation region 69 is, for example, a p-type diffusion region.

The reset transistor 26 in each signal detection circuit 14 includes the n-type charge accumulation region 67*n* as one of a drain region and a source region and includes the n-type impurity region 68*an* as the other of the drain region and the source region. The reset transistor 26 further includes a gate electrode 26*e* on the first insulating layer 71, and a portion included in the first insulating layer 71 and located between the gate electrode 26*e* and the semiconductor substrate 60 functions as a gate insulating film of the reset transistor 26.

The impurity region 68*an* is formed in the p-type semiconductor layer 65*p*. A contact plug Cp2 is connected to the impurity region 68*an* through a contact hole h2. The contact plug Cp2 is electrically connected to the feedback line 53.

The impurity regions 68*bn*, 68*cn*, 68*dn*, and 68*en*, which are n-type impurity regions, are further provided in the p-type semiconductor layer 65*p*. The impurity concentrations of the impurity regions 68*an*, 68*bn*, 68*cn*, 68*dn*, and 68*en* are higher than the impurity concentration of the first region 67*a* in the charge accumulation region 67*n*.

The signal detection transistor 22 includes the impurity regions 68*bn* and 68*cn* and a gate electrode 22*e* on the first insulating layer 71. The impurity region 68*bn* functions as, for example, a drain region of the signal detection transistor 22, and the impurity region 68*cn* functions as, for example, a source region of the signal detection transistor 22. In this example, the gate electrode 22*e* is connected to, in the layer where the address signal line 34 and the reset signal line 36 are located, a portion that is included in the electrically conductive structure 89 and that provides interconnection between the pixel electrode 12*a* and the contact plug Cp1. In other words, the electrically conductive structure 89 also has an electrical connection with the gate electrode 22*e*.

A contact plug Cp3 is connected to the impurity region 68*bn* through a contact hole h3. The above-described power-supply wire 32, which serves as a source-follower power supply, is electrically connected to the contact plug Cp3. The power-supply wire 32 is not illustrated in FIG. 3.

The address transistor 24 is further formed at the upper side of the semiconductor substrate 60. The address transistor 24 includes the impurity regions 68*en* and 68*dn* and a gate electrode 24*e* on the first insulating layer 71. The n-type the impurity region 68*en* functions as, for example, a drain region of the address transistor 24, and the n-type impurity region 68*dn* functions as, for example, a source region of the address transistor 24. A portion included in the first insulating layer 71 and located between the gate electrode 24*e* and the semiconductor substrate 60 functions as a gate insulating film of the address transistor 24.

Figure 4:
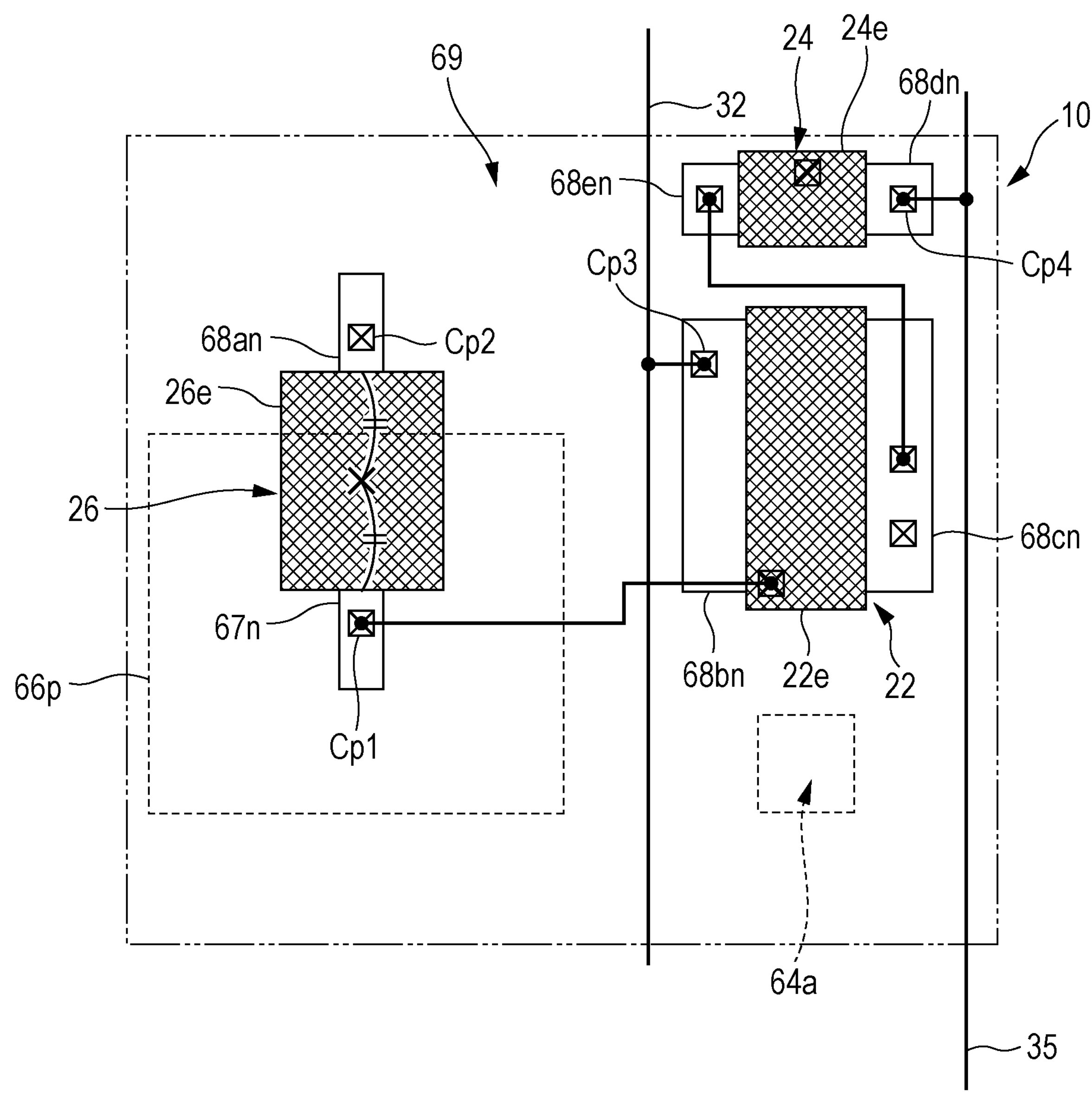
FIG. 4 is a schematic plan view illustrating one example of a layout of individual elements in one pixel in the imaging device according to the first embodiment of the present disclosure.

Although the impurity regions 68*cn* and 68*en* are provided separately in the semiconductor substrate 60, as illustrated in FIG. 4, and are electrically connected to each other through wires, the present disclosure is not limited thereto. The impurity regions 68*cn* and 68*en* may be a single diffusion region that continues in the semiconductor substrate 60. That is, the signal detection transistor 22 and the address transistor 24 may share a single diffusion region. This provides electrical interconnection between the signal detection transistor 22 and the address transistor 24. As schematically illustrated in FIG. 3, a contact plug Cp4 is connected to the impurity region 68*dn* through a contact hole h4. The contact plug Cp4 is electrically connected to the vertical signal line 35.

FIG. 4 is a schematic plan view illustrating one example of a layout of the individual elements in one pixel 10 in the imaging device 100 according to the present embodiment. The pixel 10 has, for example, a square shape of 3 μm×3 μm. Although the signal detection transistor 22, the address transistor 24, and the reset transistor 26 are illustrated in FIG. 3 as appearing in a single cross section, this is merely for convenience of description. Accordingly, a portion that does not match between a cross section obtained by cutting the element layout in FIG. 4 along one line and the cross section in FIG. 3 may arise.

The element isolation region 69 is arranged around each of the reset transistor 26, the signal detection transistor 22, and the address transistor 24. The element isolation region 69 electrically isolates the reset transistor 26, the signal detection transistor 22, and the address transistor 24 from each other.

As described above, in each pixel 10 in the imaging device 100 according to the present embodiment, the p-type region 66*p* overlaps the charge accumulation region 67*n*, when viewed from the direction orthogonal to the semiconductor substrate 60. In FIG. 4, the plan-view shape of the p-type region 66*p* is denoted by a dashed line. As illustrated in FIG. 4, in plan view, the p-type region 66*p* includes the charge accumulation region 67*n* therein. That is, in plan view, the charge accumulation region 67*n* is smaller than the p-type region 66*p* and is provided so as not to protrude from the p-type region 66*p*. In other words, in a direction immediately below the charge accumulation region 67*n*, the p-type region 66*p* is located, and the n-type semiconductor layer 62*n* is not located.

In the present embodiment, when viewed from the direction orthogonal to the semiconductor substrate 60, the p-type region 66*p* does not overlap at least one of the impurity regions 68*an*, 68*bn*, 68*cn*, 68*dn*, and 68*en*. Specifically, the p-type region 66*p* does not overlap the closest of the impurity regions 68*an*, 68*bn*, 68*cn*, 68*dn*, and 68*en* to the charge accumulation region 67*n*. The impurity regions 68*an*, 68*bn*, 68*cn*, 68*dn*, and 68*en* are one example of a plurality of second diffusion regions that contain an impurity of the second conductivity type, that are located in the third region, and that are exposed at the first surface. In the example illustrated in FIG. 4, the impurity region 68*an* is the closest of the plurality of second diffusion regions to the charge accumulation region 67*n*. The impurity region 68*bn* may be the second diffusion region that is the closest to the charge accumulation region 67*n*.

In plan view, the p-type region 66*p* overlaps a halfway point between the charge accumulation region 67*n* and the impurity region 68*an*, which is one example of the second diffusion region that is the closest to the charge accumulation region 67*n*. In FIG. 4, the halfway point is denoted by "X". The halfway point corresponds to a midpoint between a portion that is included in the charge accumulation region 67*n* and that is closest to the impurity region 68*an* and a portion that is included in the impurity region 68*an* and that is closest to the charge accumulation region 67*n*. That is, the p-type region 66*p* extends from the portion immediately below the charge accumulation region 67*n* to a position farther than the halfway point. In other words, the boundary of the p-type region 66*p* is located at a position closer to the impurity region 68*an* than to the charge accumulation region 67*n*.

For example, the plan-view shape of the p-type region 66*p* is a square shape of 1 μm×1 μm. The charge accumulation region 67*n* is located at approximately the center of the p-type region 66*p*. The shape of the p-type region 66*p* is not particularly limiting and may be another polygonal shape, such as a rectangular shape, a circular shape, or the like.

Thus, in the present embodiment, the n-type semiconductor layer 62*n* is not provided in a direction immediately below the charge accumulation region 67*n*. The n-type semiconductor layer 62*n* is provided in order to capture minority carriers, specifically, electrons, in the p-type semiconductor layer 65*p*. Since the n-type semiconductor layer 62*n* captures the electrons, dark current that flows into the charge accumulation region 67*n* is suppressed or reduced.

Meanwhile, an electron trapping site is generated in the vicinity of an interface between the n-type semiconductor layer 62*n* and the p-type semiconductor layer 63*p*. Diffusion of electrons from the trapping site is one cause of dark current in the charge accumulation region 67*n*.

In the present embodiment, the n-type semiconductor layer 62*n* is not provided immediately below the charge accumulation region 67*n*, and the p-type region 66*p* is provided. Thus, since the generation of the electron trapping site is suppressed or reduced immediately below the charge accumulation region 67*n*, dark current can be reduced.

Also, arranging the boundary of the p-type region 66*p* so as to be closer to the impurity region 68*an* than to the charge accumulation region 67*n*, when viewed from the direction orthogonal to the semiconductor substrate 60, allows the impurity region 68*an* to collect charge generated in the trapping site. Thus, since flow of charge into the charge accumulation region 67*n* can be suppressed, dark current can be further suppressed or reduced.

Figure 5:
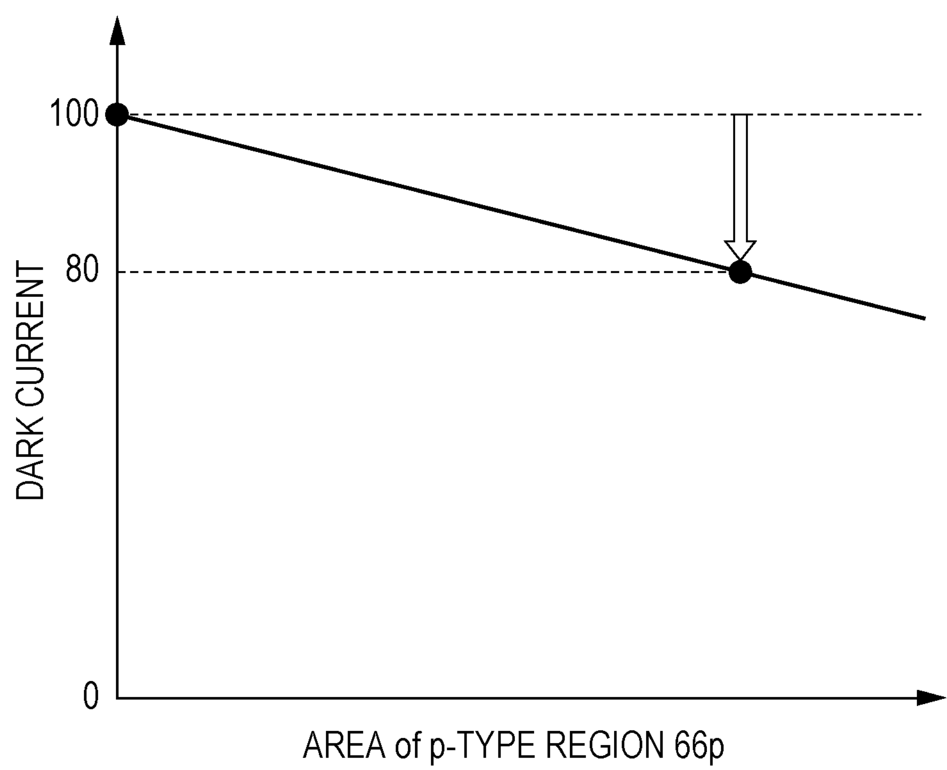
FIG. 5 is a graph illustrating dependency of dark current with respect to a first diffusion region of each pixel in the imaging device according to the first embodiment of the present disclosure on the area of a p-type region in a direction immediately below the first diffusion region.

FIG. 5 is a graph illustrating dependency of dark current with respect to the first diffusion region of each pixel in the imaging device according to the present embodiment on the area of the p-type region 66*p* in the direction immediately below the first diffusion region. In FIG. 5, the horizontal axis represents the area of the p-type region 66*p*, and the vertical axis represents the magnitude of dark current. Specifically, the magnitude of dark current when the area of the p-type region 66*p* is 0, that is, when the p-type region 66*p* is not provided, and the n-type semiconductor layer 62*n* is also provided immediately below the charge accumulation region 67*n* is assumed to be 100.

When the p-type region 66*p* having a predetermined size is provided, dark current is reduced by about 20%, as illustrated in FIG. 5. It can be seen that dark current is reduced as the area of the p-type region 66*p* increases.

Although not illustrated in FIG. 5, dark current increases when the area of the p-type region 66*p* is too large. This is because a reduction in the area of the n-type semiconductor layer 62*n* weakens the effect of the n-type semiconductor layer 62*n* capturing minority carriers in the p-type semiconductor layer 65*p*.

Consider a case in which the impurity region 68*bn* is the second diffusion region that is the closest to the charge accumulation region 67*n*. In this case, it is assumed that the area of the p-type region 66*p* increases, and the p-type region 66*p* overlaps the impurity region 68*bn* in plan view. In this case, the n-type semiconductor layer 62*n* does not overlap the impurity region 68*bn* in plan view. This facilitates that charge generated in the impurity region 68*bn* flows to the charge accumulation region 67*n* than to the n-type semiconductor layer 62*n*. That is, an increase in the area of the p-type region 66*p* leads to an increase in dark current. In the case of the layout structure illustrated in FIG. 4, when the rate of the p-type region 66*p* occupied in the pixel 10 in plan view exceeds 25%, the p-type region 66*p* overlaps the impurity region 68*bn* in plan view. Thus, the ratio of the area of the p-type region 66*p* to the area of the pixel 10 in plan view is, for example, larger than 0% and 25% or less. The same applies to a case in which the second diffusion region that is the closest to the charge accumulation region 67*n* is the impurity region 68*an* or another impurity region.

Second Embodiment

Next, a second embodiment will be described.

Figure 6:
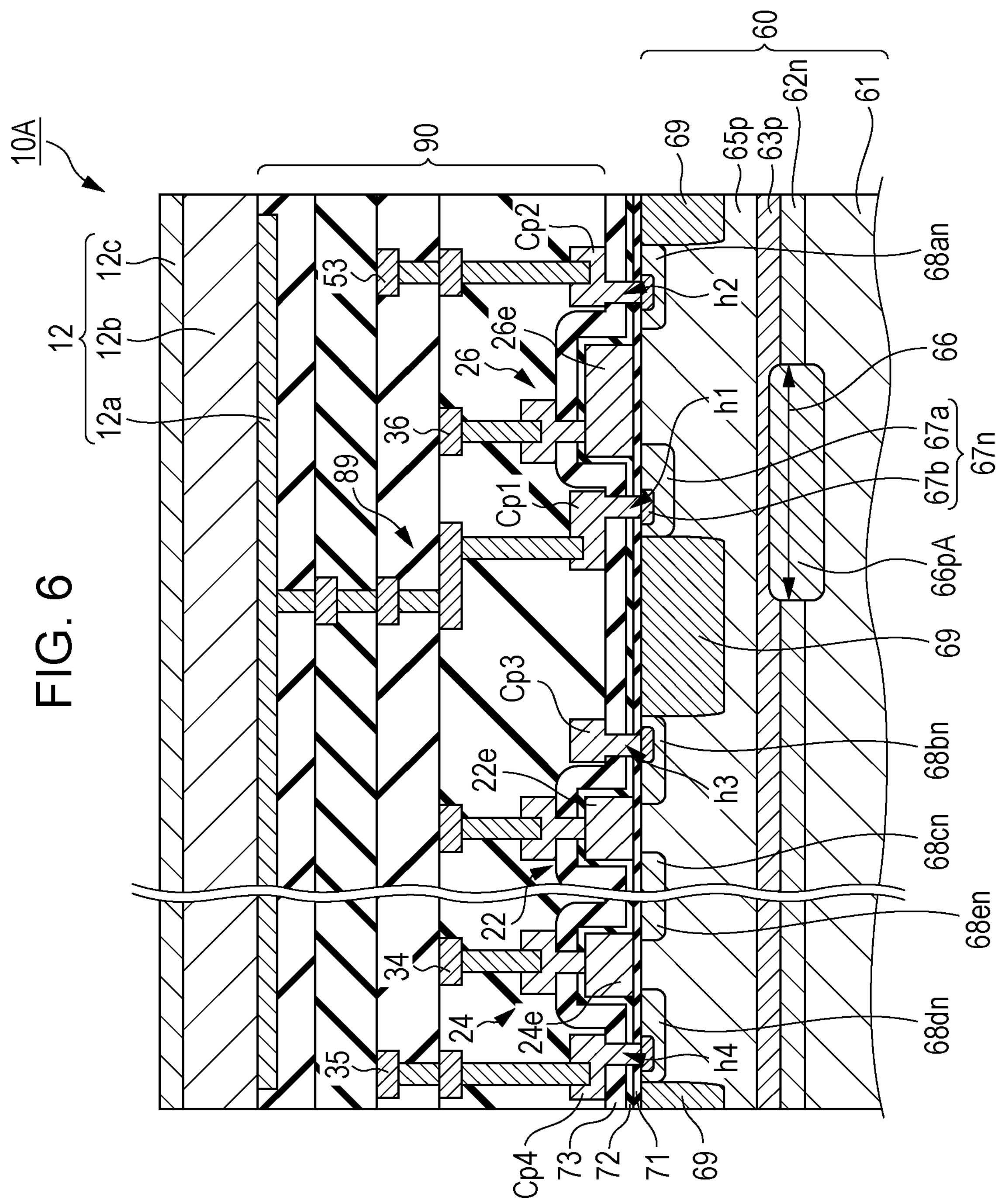
FIG. 6 is a sectional view schematically illustrating one example of a device structure of one pixel in an imaging device according to a second embodiment of the present disclosure.
Figure 7:
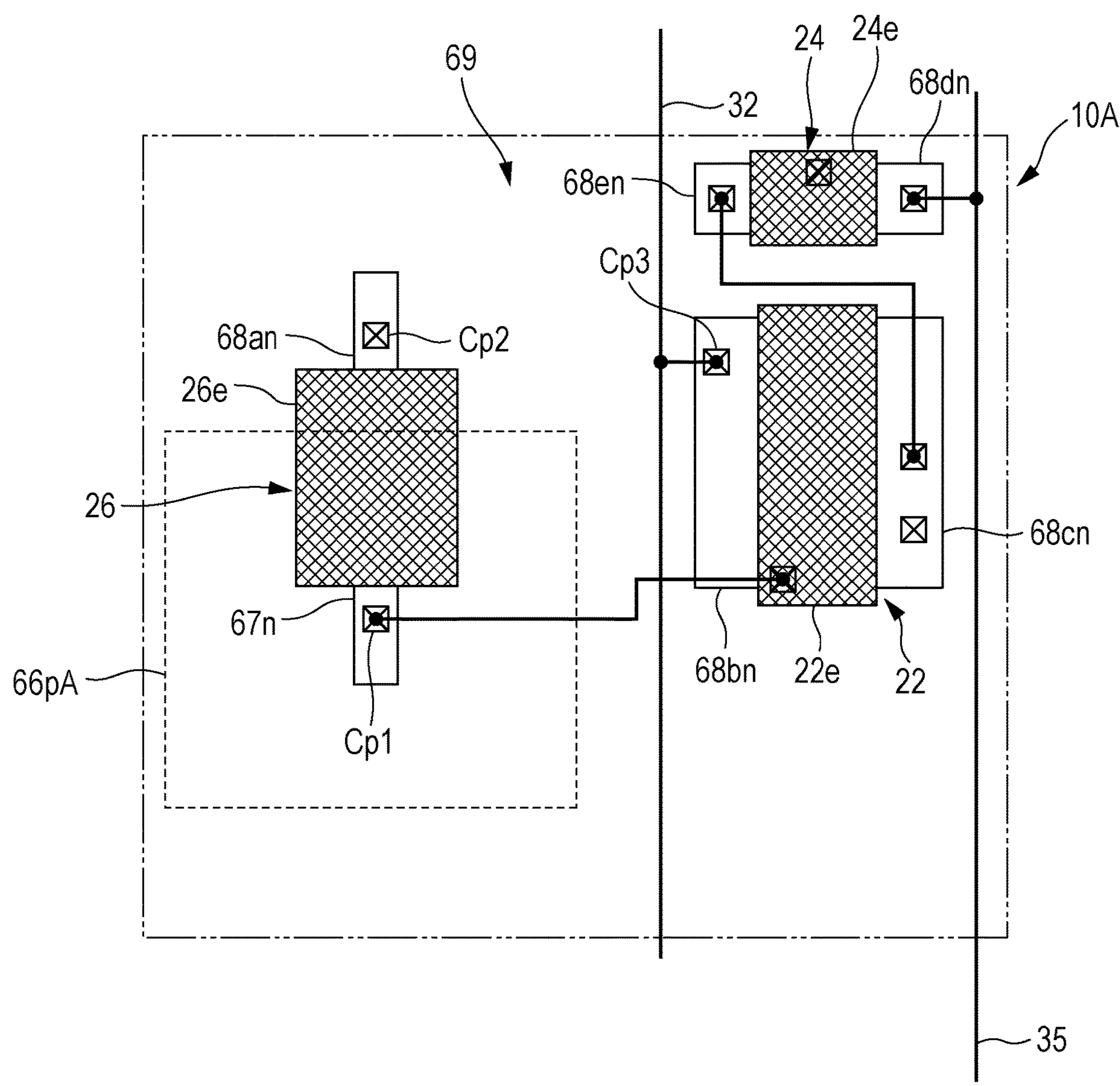
FIG. 7 is a schematic plan view illustrating one example of a layout of individual elements in one pixel in the imaging device according to the second embodiment of the present disclosure.

FIG. 6 is a sectional view schematically illustrating one example of a device structure of one pixel in an imaging device according to a second embodiment. FIG. 7 is a schematic plan view illustrating one example of a layout of individual elements in one pixel in the imaging device according to the second embodiment.

A main difference between a pixel 10A illustrated in FIG. 6 and the pixel 10 illustrated in FIG. 3 is that, in the pixel 10A, a p-type region 66*p*A, instead of the p-type region 66*p*, is provided in the through hole 66 in the n-type semiconductor layer 62*n*. In addition, the pixel 10A does not have the p-type region 64*a*, as illustrated in FIG. 7.

As illustrated in FIG. 6, the p-type region 66*p*A differs in the thickness and the impurity concentration, compared with the p-type region 66*p* according to the first embodiment. The position where the p-type region 66*p*A is provided and the shape thereof when viewed from the direction orthogonal to the semiconductor substrate 60 are the same as those of the p-type region 66*p*.

The p-type region 66*p*A is shaped to be thicker than the n-type semiconductor layer 62*n*. Specifically, a portion that is included in the p-type region 66*p*A and that is closest to the obverse surface of the semiconductor substrate 60 is closer to the obverse surface of the semiconductor substrate 60 than a portion that is included in the n-type semiconductor layer 62*n* and that is closest to the obverse surface of the semiconductor substrate 60. That is, the upper surface of the p-type region 66*p*A is closer to the obverse surface of the semiconductor substrate 60 than the upper surface of the n-type semiconductor layer 62*n*. Also, a portion that is included in the p-type region 66*p*A and that is closest to the reverse surface of the semiconductor substrate 60 is closer to the reverse surface of the semiconductor substrate 60 than a portion that is included in the n-type semiconductor layer 62*n* and that is closest to the reverse surface of the semiconductor substrate 60. That is, the lower surface of the p-type region 66*p*A is closer to the reverse surface of the semiconductor substrate 60 than the lower surface of the n-type semiconductor layer 62*n*. Specifically, the p-type region 66*p*A is provided so as to fill the through hole 66 provided in the n-type semiconductor layer 62*n* and so as to protrude from both the obverse side and the bottom side of the through hole 66. One portion of the p-type region 66*p*A is located in the p-type semiconductor layer 63*p*, and another portion of the p-type region 66*p*A is located in the supporting substrate 61. The p-type region 66*p*A is formed by, for example, ion-implanting a p-type impurity into a range that is thicker than the n-type semiconductor layer 62*n*.

The p-type region 66*p*A has a higher impurity concentration than the p-type semiconductor layer 63*p* and the p-type semiconductor layer 65*p*. Thus, the p-type region 66*p*A has a function for providing electrical interconnection between the p-type semiconductor layer 63*p* and the supporting substrate 61. That is, the p-type region 66*p*A has a function of the p-type region 64*a* in the pixel 10 according to the first embodiment. In the present embodiment, the p-type region 66*p*A is provided to be larger than the charge accumulation region 67*n* in plan view. This makes it possible to sufficiently reduce a junction resistance between the p-type semiconductor layer 63*p* and the supporting substrate 61.

This allows a region having a high impurity concentration to be arranged adjacent to the supporting substrate 61 side of the charge accumulation region 67*n*. This can further suppress or reduce charge that moves toward the charge accumulation region 67*n*. In addition, since the junction resistance between the p-type semiconductor layer 63*p* and the supporting substrate 61 can be reduced, for example, holes that are generated at a p-n junction are easily discharged to the supporting substrate 61. This can suppress or reduce image deterioration due to variations in the substrate potential.

The concentration of the impurity may differ inside the p-type region 66*p*A. For example, when viewed from the direction orthogonal to the semiconductor substrate 60, a first region having a high impurity concentration may be provided in the vicinity of the center of the through hole 66 provided in the n-type semiconductor layer 62*n*, and a second region having a low impurity concentration may be provided around the first region. For example, the impurity concentration of the first region is higher than the impurity concentration of each of the p-type semiconductor layer 63*p* and the p-type semiconductor layer 65*p*. The impurity concentration of the second region is substantially equal to the impurity concentrations of the p-type semiconductor layer 63*p* and the p-type semiconductor layer 65*p*. This can reduce the strength of an electric field at the p-n junction between the p-type region 66*p*A and the n-type semiconductor layer 62*n* and can suppress or reduce flow of electrons into the charge accumulation region 67*n*.

Other Embodiments

Although imaging devices according to one or more aspects have been described above based on the embodiments, the present disclosure is not limited to the embodiments. Modes obtained by making various modifications conceived by those skilled in the art to the above-described embodiments and modes constructed by a combination of the constituent elements in different embodiments are also encompassed in the scope of the present disclosure, as long as such modes do not depart from the spirit of the present disclosure.

For example, although an example in which the p-type region 66*p* is provided at a portion in the direction immediately below the charge accumulation region 67*n* and around the portion and is not provided in a direction immediately below the impurity regions 68*an*, 68*bn*, 68*cn*, 68*dn*, and 68*en*, which are one example of the second diffusion regions, has been described in the above embodiment, the present disclosure is not limited thereto. For example, a portion of the p-type region 66*p* may also be provided in the direction immediately below the impurity region 68*an*.

For example, in plan view, the boundary of the p-type region 66*p* may be located closer to the charge accumulation region 67*n* than to the halfway point between the charge accumulation region 67*n* and the impurity region 68*an*.

Each of the signal detection transistor 22, the address transistor 24, and the reset transistor 26 may be an N-channel MOSFET or a P-channel MOSFET. When each of these transistors is a P-channel MOSFET, the impurity of the first conductivity type is a p-type impurity, and the impurity of the second conductivity type is an n-type impurity. All of the transistors do not have to be unified to either N-channel MOSFETs or P-channel MOSFETs. When the transistors in the pixels are implemented by N-channel MOSFETs, and electrons are used as signal charge, the arrangement of the source and the drain of each of the transistors may be interchanged.

Also, in each embodiment described above, various changes, replacements, additions, and omissions can be made in the claims or in an equivalent scope thereof.

What is claimed is:

1. An imaging device comprising:
- a semiconductor substrate having a first surface and a second surface at an opposite side of the first surface; and
- a pixel including
  - a photoelectric converter that converts light into charge, and
  - a first diffusion region that is electrically connected to the photoelectric converter, wherein:
- the semiconductor substrate includes
  - a first region that contains an impurity of a first conductivity type,
  - a second region that contains an impurity of a second conductivity type different from the first conductivity type and that is closer to the first surface than the first region is,
  - a third region that contains an impurity of the first conductivity type and that is closer to the first surface than the second region is, and a fourth region that contains an impurity of the first conductivity type and that penetrates the second region to provide connection between the first region and the third region;

the first diffusion region contains an impurity of the second conductivity type;

the first diffusion region is located in the third region and exposed at the first surface; and, in plan view, the fourth region overlaps the entire first diffusion region.

2. The imaging device according to claim 1, wherein:

the pixel further includes a plurality of second diffusion regions that contain an impurity of the second conductivity type;

the plurality of second diffusion regions are located in the third region and exposed at the first surface; and, in plan view, the fourth region does not overlap a closest second diffusion region of the plurality of second diffusion regions to the first diffusion region.

3. The imaging device according to claim 2, wherein, in plan view, the fourth region overlaps a half-way point between the first diffusion region and the closest second diffusion region of the plurality of second diffusion regions to the first diffusion region.

4. The imaging device according to claim 1, wherein:

a portion that is included in the fourth region and that is closest to the first surface is closer to the first surface than a portion that is included in the second region and that is closest to the first surface is; and a portion that is included in the fourth region and that is closest to the second surface is closer to the second surface than a portion that is included in the second region and that is closest to the second surface is.

5. The imaging device according to claim 1, wherein an impurity concentration of the fourth region is higher than an impurity concentration of each of the first region, the second region, and the third region.

6. The imaging device according to claim 1, wherein, during operation, a potential of the second region is controlled to be constant.

7. The imaging device according to claim 1, wherein the second region is not electrically connected to the first diffusion region.

* * * * *